US00RE50596E

(19) United States
(12) Reissued Patent
Fifield et al.

(10) Patent Number: US RE50,596 E
(45) Date of Reissued Patent: Sep. 23, 2025

(54) ON-CHIP RELIABILITY MONITOR AND METHOD

(71) Applicant: MARVELL ASIA PTE, LTD., Singapore (SG)

(72) Inventors: John A. Fifield, Underhill, VT (US); Eric Hunt-Schroeder, Essex Junction, VT (US); Mark D. Jacunski, Colchester, VT (US)

(73) Assignee: MARVELL ASIA PTE LTD, Singapore (SG)

(21) Appl. No.: 17/488,996

(22) Filed: Sep. 29, 2021

Related U.S. Patent Documents

Reissue of:
(64) Patent No.: 10,429,434
Issued: Oct. 1, 2019
Appl. No.: 15/903,231
Filed: Feb. 23, 2018

(51) Int. Cl.
*G01R 31/26* (2020.01)
*G01R 31/28* (2006.01)

(52) U.S. Cl.
CPC ..... *G01R 31/2642* (2013.01); *G01R 31/2875* (2013.01); *G01R 31/2879* (2013.01)

(58) Field of Classification Search
CPC combination set(s) only.
See application file for complete search history.

(56) References Cited

U.S. PATENT DOCUMENTS 6,731,179 B2 5/2004 Abadeer et al.
7,710,141 B2 5/2010 La Rosa et al.
8,095,907 B2 1/2012 Bickford et al.
8,274,301 B2 * 9/2012 Feng ..... G01R 31/2856 324/750.05
8,847,604 B2 9/2014 Baumann et al.
(Continued)

FOREIGN PATENT DOCUMENTS

CN 1604326 A 4/2005
CN 101706551 A 5/2010
(Continued)

OTHER PUBLICATIONS

Chinese Office Action and Search Report for Chinese Application No. 2020112944122 dated Nov. 14, 2023.
(Continued)

*Primary Examiner* — Kenneth Whittington

(57) ABSTRACT

Disclosed are an on-chip reliability monitor and method. The monitor includes a test circuit with a test device, a reference circuit with a reference device, and a comparator circuit. The monitor periodically switches from operation in a stress mode, to operation in a test mode, and back. During each stress mode, the test device is subjected to stress conditions that emulate the operating conditions of an on-chip functional device while the reference device remains essentially unstressed. During each test mode, the comparator circuit compares a parameter of the test device to the same parameter of the reference device and outputs a status signal based on the difference between the parameters. When the status signal switches values, it is an indicator that the functional device has been subjected to a predetermined number of power-on-hours. Optionally, multiple monitors can be cascaded together to more accurately monitor stress-induced changes over time.

37 Claims, 9 Drawing Sheets

(56) References Cited

U.S. PATENT DOCUMENTS

| | | | | |
|---|---|---|---|---|
| 9,054,793 | B2 | 6/2015 | Cook et al. | |
| 9,310,426 | B2 | 4/2016 | Anemikos et al. | |
| 10,429,434 | B2 | 10/2019 | Fifield et al. | |
| 2006/0267621 | A1 | 11/2006 | Harris et al. | |
| 2006/0292845 | A1* | 12/2006 | Chiang | H01L 21/32051 438/597 |
| 2007/0063309 | A1 | 3/2007 | Ausserlechner | |
| 2009/0224795 | A1* | 9/2009 | Nicollian | G01R 31/2648 324/762.1 |
| 2010/0194400 | A1* | 8/2010 | Baumann | G01R 31/3016 324/76.19 |
| 2011/0018575 | A1 | 1/2011 | Chen et al. | |
| 2012/0051392 | A1* | 3/2012 | Grillberger | H01L 22/12 374/57 |
| 2013/0307663 | A1 | 11/2013 | Roth et al. | |
| 2014/0015542 | A1 | 1/2014 | Bai et al. | |
| 2014/0095140 | A1 | 4/2014 | Weir et al. | |
| 2014/0103937 | A1 | 4/2014 | Khan et al. | |
| 2015/0061707 | A1 | 3/2015 | Balasubramanian et al. | |
| 2015/0236696 | A1* | 8/2015 | Saen | G06F 11/183 326/10 |
| 2016/0300148 | A1 | 10/2016 | Kelly | |
| 2017/0074923 | A1 | 3/2017 | Su et al. | |
| 2017/0160317 | A1* | 6/2017 | Naidu | G01R 31/31715 |
| 2019/0265293 | A1 | 8/2019 | Fifield et al. | |
| 2020/0202965 | A1 | 6/2020 | Merritt | |
| 2021/0158731 | A1 | 5/2021 | Hu et al. | |

FOREIGN PATENT DOCUMENTS

| | | | | |
|---|---|---|---|---|
| CN | 101963650 | A | | 2/2011 |
| CN | 103197226 | A | | 7/2013 |
| CN | 103955579 | A | | 7/2014 |
| CN | 106055418 | A | | 10/2016 |
| CN | 106529026 | A | | 3/2017 |
| CN | 107256299 | A | | 10/2017 |
| JP | H1074167 | A | * | 3/1998 |
| TW | 201221925 | A | | 6/2012 |

OTHER PUBLICATIONS

Taiwanese Office Action for Taiwanese Application No. TW108102551 dated Oct. 8, 2019.

IBM, "Timing Critical Path Based Digital Chip Aging Measurement," www.ip.com. IPCOM00183721D, Jun. 1, 2009, pp. 1-6.

IBM, "On-Chip Test Structure," www.ip.com, IPCOM000169987D, May 5, 2008, pp. 1-5.

IBM, "Circuit for On-Chip Measurement of Change of Threshold Voltage of Devices Due to Stress and Aging," www.ip.com, IPCOM000193032D, Feb. 8, 2010, pp. 1-4.

Tae-Hyoung Kim, "Silicon Odometer: An On-Chip Reliability Monitor for Measuring Frequency Degradation of Digital Circuits," IEEE Journal of Solid State Circuits, vol. 43, No. 4, 2008, pp. 874-880.

Allan Webber, "Calculating Useful Lifetimes of Embedded Processors," Texas Instruments Application Report, Oct. 2017, pp. 1-9.

* cited by examiner

ON-CHIP RELIABILITY MONITOR AND METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

Field of the Invention

The present invention relates to device reliability and, more particularly, to an on-chip reliability monitor and method.

Description of Related Art

Various mechanisms (e.g., hot carrier injection, time-dependent dielectric breakdown, negative-bias temperature instability (NBTI), positive-bias temperature instability (PBTI), etc.) associated with different classes of devices incorporated into integrated circuit (IC) chips can cause chip performance to degrade over time as a result of stress conditions (e.g., high temperatures and/or voltages). Typically, in order to predict how IC chips in a given semiconductor technology will perform over time and in response to high stress conditions, all devices available in that given semiconductor technology are subjected to accelerated voltage and/or temperature stress tests in a laboratory environment at the wafer or module levels and/or in a test system environment. Then, based on the results of the accelerated stress testing, performance degradation models and end of life (EOL) predictions are generated. Typically, in order to monitor an IC chip's reliability, a power-on hours (POH) monitor is used to track the amount of time the chip is powered-on and the number of POHs is compared to the end of life predictions. Unfortunately, the environmental assumptions associated with the selected sample of products used for making performance degradation models and end of life predictions may be different than the actual environmental conditions in other products. For example, the operating temperature, operating voltage, power-on-hours (POH), etc. of IC chips may vary from product to product. Thus, the resulting performance degradation models and EOL predictions may not be applicable across all products. In this case, tracking POHs alone may result in chip failures before the predicted EOL (as measured in POHs) or, alternatively, may result in chips being scrapped too early.

SUMMARY

In view of the foregoing, disclosed herein are an on-chip reliability monitor and reliability monitoring method. The reliability monitor can include a test circuit with a test device, a reference circuit with a reference device and a comparator circuit connected to the test circuit and the reference circuit. The reliability monitor can be alternatingly operable in stress and test modes and, specifically, can periodically switch from operation in the stress mode to operation in the test mode and back again. During each stress mode, the test device can be subjected to stress conditions that emulate the operating conditions of an on-chip functional device while the reference device remains essentially unstressed. During each test mode, the stress conditions can be removed from the test device and the comparator circuit can compare a parameter of the test device to the same parameter of the reference device and can output a status signal based on the difference between the parameters. Specifically, the comparator circuit can switch the status signal from one value to another when the difference between the parameters reaches a predetermined threshold amount and can ensure that the status signal remains constant once switched. It should be noted that, when the parameter at issue is known to change at a relatively high rate in response to applied stress at the beginning of life and to change at a relatively low rate in response to applied stress towards the end of life and when a small delta in that parameter is difficult to detect, multiple reliability monitors can be cascaded together in order to more accurately monitor stress-induced changes near the end of life, as described in greater detail below.

More particularly, disclosed herein is an embodiment of an integrated circuit (IC) chip that includes a substrate and a reliability monitor on the substrate. The reliability monitor can include a test circuit with a test device and a reference circuit with a reference device. Both the test device and the reference device can be essentially identical to an on-chip functional device. The reliability monitor can further include a comparator circuit that is connected to both the test circuit and the reference circuit. The reliability monitor can be alternatingly operable in stress and test modes (e.g., can periodically switch from operation in a stress mode to operation in a test mode and back), when the IC chip is powered on. During each stress mode, the test device can be subjected to stress conditions that emulate the operating conditions of the on-chip functional device while the reference device remains essentially unstressed. During each test mode, the stress conditions can be removed from the test device and the comparator circuit can compare a specific parameter (referred to as a test parameter) of the test device to the same parameter (referred to as a reference parameter) of the reference device and can output a status signal based on the difference between the test parameter and the reference parameter. Specifically, the comparator circuit can switch the status signal from one value to another (e.g., from low to high, logic value '0' to '1') when the difference between the test parameter and the reference parameter reaches a predetermined threshold amount and can further ensure that the status signal remains constant once switched. This switch in the value of the status signal will be indicative of the on-chip functional device being powered on for some predetermined number of hours (e.g., for X power-on hours (POHs)).

Also disclosed herein is another embodiment of an integrated circuit (IC) chip that includes a substrate and multiple cascaded reliability monitors on the substrate. Specifically, oftentimes a parameter at issue is known to change at a relatively high rate in response to applied stress at the beginning of life and to change at a relatively low rate in response to applied stress towards the end of life. Furthermore, a small delta in that parameter may be difficult to detect. In this case, multiple essentially identical reliability monitors can be cascaded together in order to more accurately monitor stress-induced changes particularly near the end of life.

Each reliability monitor can include a test circuit with a test device and a reference circuit with a reference device. Both the test device and the reference device can be essentially identical to an on-chip functional device. Each reliability monitor can further include a comparator circuit that is connected to both the test circuit and the reference circuit. Each reliability monitor can be alternatingly operable in stress and test modes when the IC chip is powered on and that particular reliability monitor is enabled. Specifically, once enabled, a reliability monitor can periodically switch from operation in the stress mode to operation in the test mode and back again. During each stress mode, the test device can be subjected to stress conditions that emulate the operating conditions of the on-chip functional device while the reference device remains essentially unstressed. During each test mode, the stress conditions can be removed from the test device and the comparator circuit can compare a specific parameter (referred to as a test parameter) of the test device to the same parameter (referred to as a reference parameter) of the reference device and can output a status signal based on the difference between the test parameter and the reference parameter. Specifically, the comparator circuit can switch the status signal from one value to another (e.g., from low to high, from logic value '0' to '1') when the difference between the test parameter and the reference parameter reaches a predetermined threshold amount and can further ensure that the status signal remains constant once switched.

The multiple cascaded reliability monitors can include at least a first reliability monitor, which is enabled by an enable signal, and a second reliability monitor, which is coupled to the first reliability monitor and which is only enabled when the status signal output from the first reliability monitor switches values.

Also disclosed herein is a reliability monitoring method for a functional device on an integrated circuit (IC) chip and, thereby for the IC chip. The method can include providing an IC chip that includes, on a substrate, a functional device and one or more reliability monitors for the functional device, as discussed above with regard to the structure embodiments.

The method can further include powering on the IC chip and, after powering on the IC chip, enabling a reliability monitor so that the reliability monitor alternatingly operates in stress and test modes (e.g., so that the reliability monitor periodically switches from operation in a stress mode to operation in a test mode and back, when the IC chip is powered on). Operating the reliability monitor in the stress mode includes subjecting the test device to stress conditions that emulate the operating conditions of the on-chip functional device and leaving the reference device unstressed. Operating the reliability monitor in the test mode includes removing the stress conditions from the test device, comparing a test parameter of the test device to a reference parameter of the reference device, and outputting a status signal based on a difference between the test parameter and the reference parameter. Specifically, a value of the status signal can be switched (e.g., from low to high, from logic value '0' to '1') when the difference between the test parameter and the reference parameter reaches a predetermined threshold amount. The method can further include ensuring that the status signal remains constant, once switched. This switch in the value of the status signal will be indicative of the on-chip functional device being powered on for some predetermined number of hours (e.g., for X power-on hours (POHs)).

Optionally, the IC chip can include, not just a single reliability monitor, but rather multiple cascaded reliability monitors that are essentially identical (e.g., at least a first reliability monitor and a second reliability monitor coupled to the first reliability monitor). In this case, the method can include using an enable signal to enable the first reliability monitor such that the first reliability monitor alternatingly operates in the stress and test modes. Then, when a status signal output from the first reliability monitor switches values, using the status signal from the first reliability monitor to enable the second reliability monitor so that the second reliability monitor alternatingly operates in the stress and test modes.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
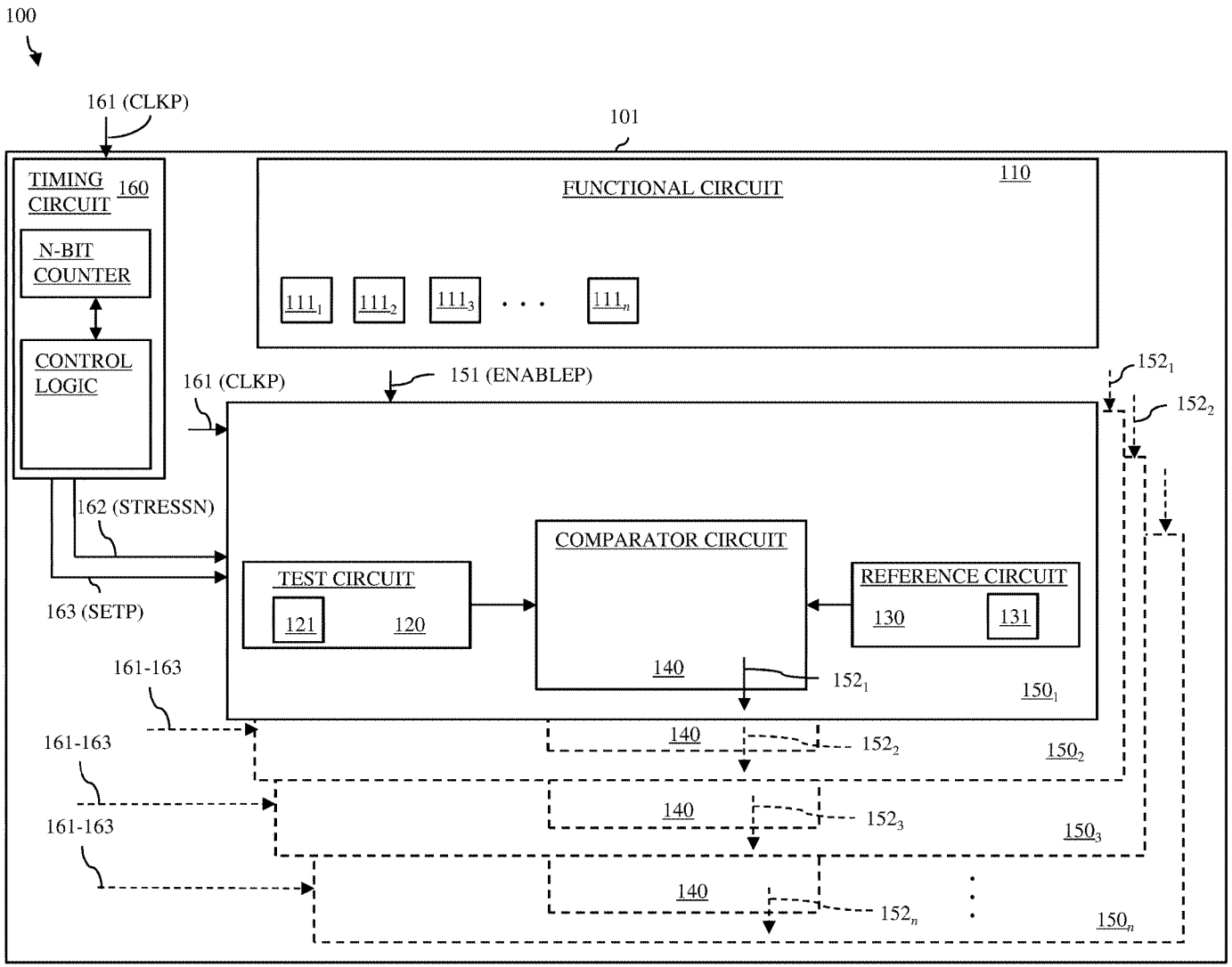
FIG. 1 is a block diagram illustrating embodiments of an integrated circuit (IC) chip with on-chip reliability monitor(s)

As mentioned above, various mechanisms (e.g., hot carrier injection, time-dependent dielectric breakdown, negative-bias temperature instability (NBTI), positive-bias temperature instability (PBTI), etc.) associated with different classes of devices incorporated into integrated circuit (IC) chips can cause chip performance to degrade over time as a result of stress conditions (e.g., high temperatures and/or voltages). Typically, in order to predict how IC chips in a given semiconductor technology will perform over time and in response to high stress conditions, all devices available in that given semiconductor technology are subjected to accelerated voltage and/or temperature stress tests in a laboratory environment at the wafer or module levels and/or in a test system environment. Then, based on the results of the accelerated stress testing, performance degradation models and end of life (EOL) predictions are generated. Typically, in order to monitor an IC chip's reliability, a power-on hours (POH) monitor is used to track the amount of time the chip is powered-on and the number of POHs is compared to the end of life predictions. Unfortunately, the environmental assumptions associated with the selected sample of products used for making performance degradation models and end of life predictions may be different than the actual environmental conditions in other products. For example, the operating temperature, operating voltage, power-on-hours (POH), etc. of IC chips may vary from product to product. Thus, the resulting performance degradation models and EOL predictions may not be applicable across all products. In this case, tracking POHs alone may result in chip failures before the predicted EOL (as measured in POHs) or, alternatively, may result in chips being scrapped too early.

In view of the foregoing, disclosed herein are an on-chip reliability monitor and reliability monitoring method. The reliability monitor can include a test circuit with a test device, a reference circuit with a reference device and a comparator circuit connected to the test circuit and the reference circuit. The reliability monitor can be alternatingly operable in stress and test modes and, specifically, can periodically switch from operation in the stress mode to operation in the test mode and back again. During each stress mode, the test device can be subjected to stress conditions that emulate the operating conditions of an on-chip functional device while the reference device remains essentially unstressed. During each test mode, the stress conditions can be removed from the test device and the comparator circuit can compare a parameter of the test device to the same parameter of the reference device and can output a status signal based on the difference between the parameters. Specifically, the comparator circuit can switch the status signal from one value to another when the difference between the parameters reaches a predetermined threshold amount and can ensure that the status signal remains constant once switched. It should be noted that, when the parameter at issue is known to change at a relatively high rate in response to applied stress at the beginning of life and to change at a relatively low rate in response to applied stress towards the end of life and when a small delta in that parameter is difficult to detect, multiple reliability monitors can be cascaded together in order to more accurately monitor stress-induced changes near the end of life, as described in greater detail below.

FIG. 1 is a block diagram illustrating embodiments of an integrated circuit (IC) chip 100. The IC chip 100 can include a substrate 101 and a functional circuit 110 on the substrate 101. The functional circuit 110 can be, for example, a circuit required for operation of a product (e.g., a memory circuit, processing circuit, etc.). In any case, this functional circuit 110 can include, for example, at least one functional device 111 and, optionally, more than one functional device (e.g., see functional devices $\mathbf{111}_{1\text{-}n}$). The functional devices $\mathbf{111}_{1\text{-}n}$ can be active devices, such as field effect transistors (FETs) or any other type of active semiconductor device.

The IC chip 100 can further include, on the same substrate 101, at least one reliability monitor 150 and, optionally, more than one reliability monitor (e.g., see reliability monitors $\mathbf{150}_{1\text{-}n}$) for the given on-chip functional device 111 and, thereby for the functional circuit 110 itself. Such a reliability monitor 150 can include a test circuit 120 with a test device 121, a reference circuit 130 with a reference device 131, and a comparator circuit 140 coupled to the test circuit 120 and to the reference circuit 130. The reliability monitor 150 can further be configured to impart stress on the test device 121 such that the test device 121 and the given on-chip functional device 111 are concurrently subjected to essentially the same stress conditions (e.g., temperature and/or voltage bias conditions) over time and, thus, such that the test device 121 and the given on-chip functional device 111 are susceptible to the same failure mechanism (e.g., hot electron injection, time-dependent dielectric breakdown, etc.). The reliability monitor 150 can also be configured to output a status signal 152 (e.g., a flag) to indicate whether or not a performance parameter (e.g., a saturation drain current, a threshold voltage, etc.) of the test device 121 has degraded by some predetermined threshold amount due to the failure mechanism.

For example, a reliability monitor 150 can be configured to output a status signal 152 that indicates when the saturation drain current of the test device 121 has decreased by some predetermined threshold amount and/or when the threshold voltage of the test device 121 has increased by some predetermined threshold voltage amount. Those skilled in the art will recognize that the threshold voltage and saturation drain current are inversely related. That is, saturation drain current will typically decrease when the threshold voltage increases.

Specifically, a reliability monitor 150 can be configured so that, when the IC chip 100 is powered on and the reliability monitor 150 is enabled by an enable signal, it alternatingly operates in stress and test modes and, particularly, so that it periodically switches from operation in a stress mode to operation in a test mode and back again. During each stress mode, the test device 121 can be subjected to specific stress conditions that emulate the operating conditions of the on-chip functional device 111, thereby making the test device 121 susceptible to the same failure mechanism(s) as the on-chip functional device 111. During this stress mode, the reference device 131 remains essentially unstressed. During each test mode, the stress conditions can be removed from the test device 121 and the comparator circuit 140 can compare a specific performance parameter (referred to as a test parameter, such as saturation drain current or threshold voltage) of the test device 121 to the same performance parameter (referred to as a reference parameter) of the reference device 131 and can output a status signal 152 based on the difference between the test parameter and the reference parameter. That is, the comparator circuit 140 can switch the status signal 152 from one value to another (e.g., from low to high, from logic value '0' to '1') when the difference between the test parameter and the reference parameter reaches a predetermined threshold amount. The comparator circuit 140 can further be configured to ensure that the status signal 152 remains constant once switched and to ensure that, when the IC chip 100 is powered off and back on again, the status signal 152 will be automatically reset to its last held value. Thus, when the IC chip 100 is powered off and then back on, the status signal 152 of an enabled reliability monitor 150 will be reset to low (i.e., to a logic value '0') if it was low when the IC chip 100 was powered off and will be reset to high (i.e., to a logic value '1') if it was high when the IC chip 100 was powered off.

The IC chip 100 also includes a timing circuit 160, which receives a primary clock signal 161 (CLKP) and which outputs multiple additional clock signals (e.g., clock signal 162 (STRESSN) and clock signal 163 (SETP)). The clock signals 161-163 are received by the reliability monitor 150 and, in conjunction with several internally generated signals (e.g., clock signal 164 (STRESSP), clock signal 165 (SENSEP), clock signal 166 (SENSEN), latch signal 167 (SENSEP_D) and latch signal 168 (LATCHP_D)) control the timing of the various components of the reliability monitor 150, as discussed in greater detail below, so that the reliability periodically switches to the test mode, so that the duration of the test mode is sufficient to allow for capture of the status of the test device 121 (i.e., to compare the specific performance parameter of the test device 121 and the reference device 131) and so that the reliability monitor otherwise operates in the stress mode.

Additionally, it should be noted that, based on empirical data and/or simulation data, the predetermined threshold amount of degradation can be some threshold amount known or expected to occur over the course of a given number of power-on-hours (POHs) starting at the beginning of life (BOL) of the device. Thus, the switch in the value of the status signal 152 will be indicative of the on-chip functional device being powered on for that given number of hours (e.g., for X power-on hours (POHs)).

For example, the predetermined threshold amount of degradation, which triggers switching of the value of the status signal 152 from low to high, can be that amount of degradation expected to be exhibited by the on-chip functional device 111 upon reaching the number of POHs specified in end of life (EOL) predictions. In this case, only a single reliability monitor 150 would be needed on the IC chip 100 and the status signal 152 (i.e., the flag) would indicate whether or not the predicted EOL has been reached and, thus, whether or not the functional circuit 110 should be considered reliable.

Figure 2:
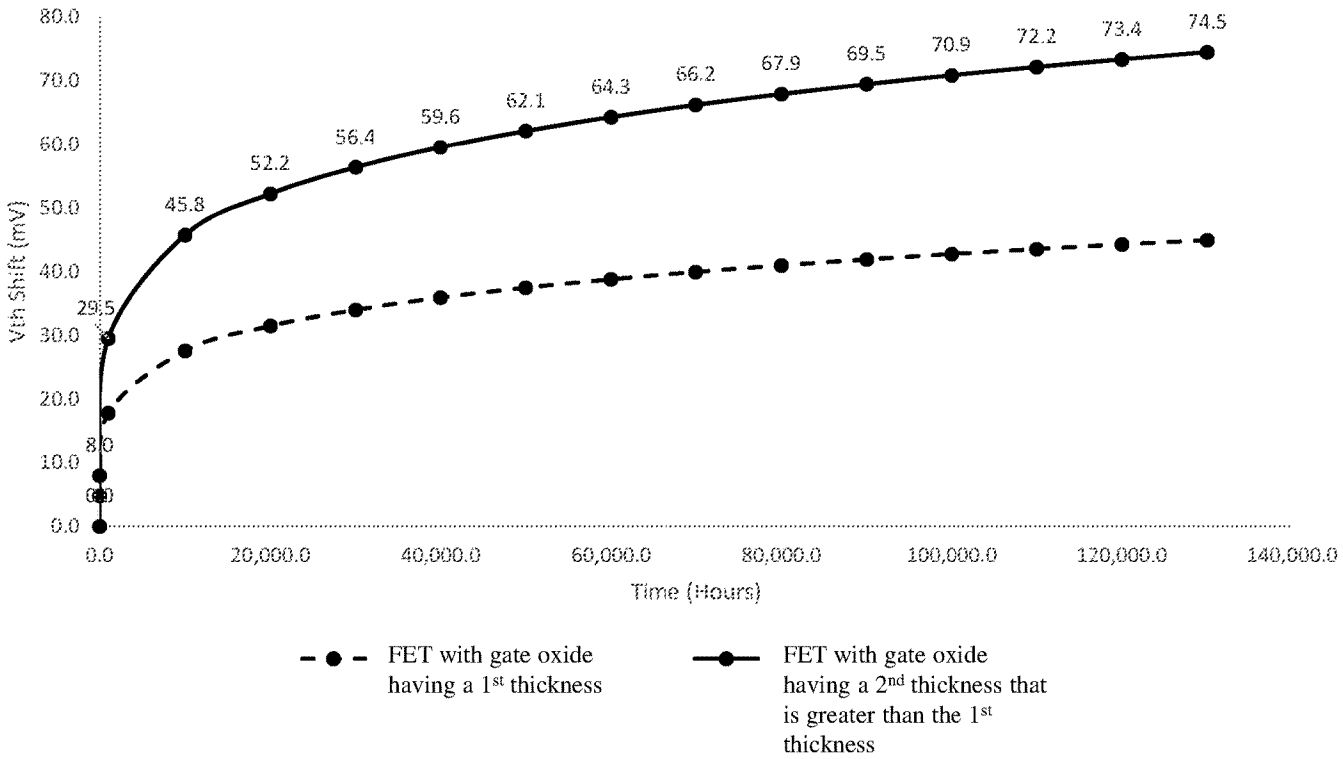
FIG. 2 is a graph showing threshold voltage shifts over time for two different field effect transistors (FETs) having different gate oxide thicknesses.

Oftentimes, however, the performance parameter at issue (e.g., saturation drain current, threshold voltage, etc.) will change at a relatively high rate in response to applied stress at the BOL, but will change at a relatively low rate in response to the same applied stress towards EOL. Furthermore, the small delta in the performance parameter towards EOL may be difficult to detect. For example, FIG. 2 is a graph showing threshold voltage shifts over time for two different field effect transistors (FETs), one with a first gate oxide thicknesses (e.g., 16 nm) and and the other with a second gate oxide thickness (e.g., 200 nm), that are subjected to the same operating conditions from BOL to EOL (e.g., 100° C. and 0.95 Vgs). As illustrated, both of these FETs exhibit a large increase in threshold voltage due to some failure mechanism (e.g., due to negative bias temperature instability (NBTI)) in the first 20,000 POHs, but the rate of change significantly decreases over time. Those skilled in the art will recognize that threshold voltage shifts are typically inversely related to saturation drain current shifts.

In this case (i.e., when EOL parameter shifts are small and difficult to detect), multiple essentially identical reliability monitors $\mathbf{150}_{1\text{-}n}$ can be cascaded together in order to more accurately monitor stress-induced changes particularly near EOL. The cascaded reliability monitors can include, for example, first reliability monitor $\mathbf{150}_1$ that is enabled by an initial enable signal 151 and monitors the given on-chip functional device 111 during the initial X POHs of the IC chip 100, with a second reliability monitor $\mathbf{150}_2$ that is enabled by the status signal 1521 only after the initial X POHs has been reached and that monitors the given on-chip functional device 111 for the next X POHs of the IC chip 100, and so on. With this configuration, the first reliability monitor $\mathbf{150}_1$ in the cascade of reliability monitors $\mathbf{150}_{1\text{-}n}$ will monitor the performance parameter of a corresponding test device during the initial X POHs of the IC chip 100, when a relatively large change will occur in performance parameter of the on-chip functional device 111; whereas the last reliability monitor $\mathbf{150}_n$ in the cascade of reliability monitors $\mathbf{150}_{1\text{-}n}$ will monitor the performance parameter of another test device in the last X POHs of the IC chip 100, when only a relatively small change will occur in the performance parameter of the on-chip functional device 111. However, since the test device 121 in the last reliability monitor $\mathbf{150}_n$ is only subjected to the stress conditions during the last X POHs of the IC chip 100, it will exhibit a relatively large change in the performance parameter. This relatively large change in the performance parameter of the test device 121 of the last reliability monitor 150, can be readily detected and will occur concurrently with a relatively small change in the performance parameter of the on-chip functional device 111 near its EOL. Thus, only when the status signal $\mathbf{152}_n$ (i.e., the flag) of the last reliability monitor 150, of the multiple cascaded reliability monitors $\mathbf{150}_{1\text{-}n}$ switches values (e.g., from low to high, from logic value '0' to '1') will the functional circuit 110 be deemed no longer reliable and the IC chip 100 be deemed to have reached the EOL.

Figure 3A:
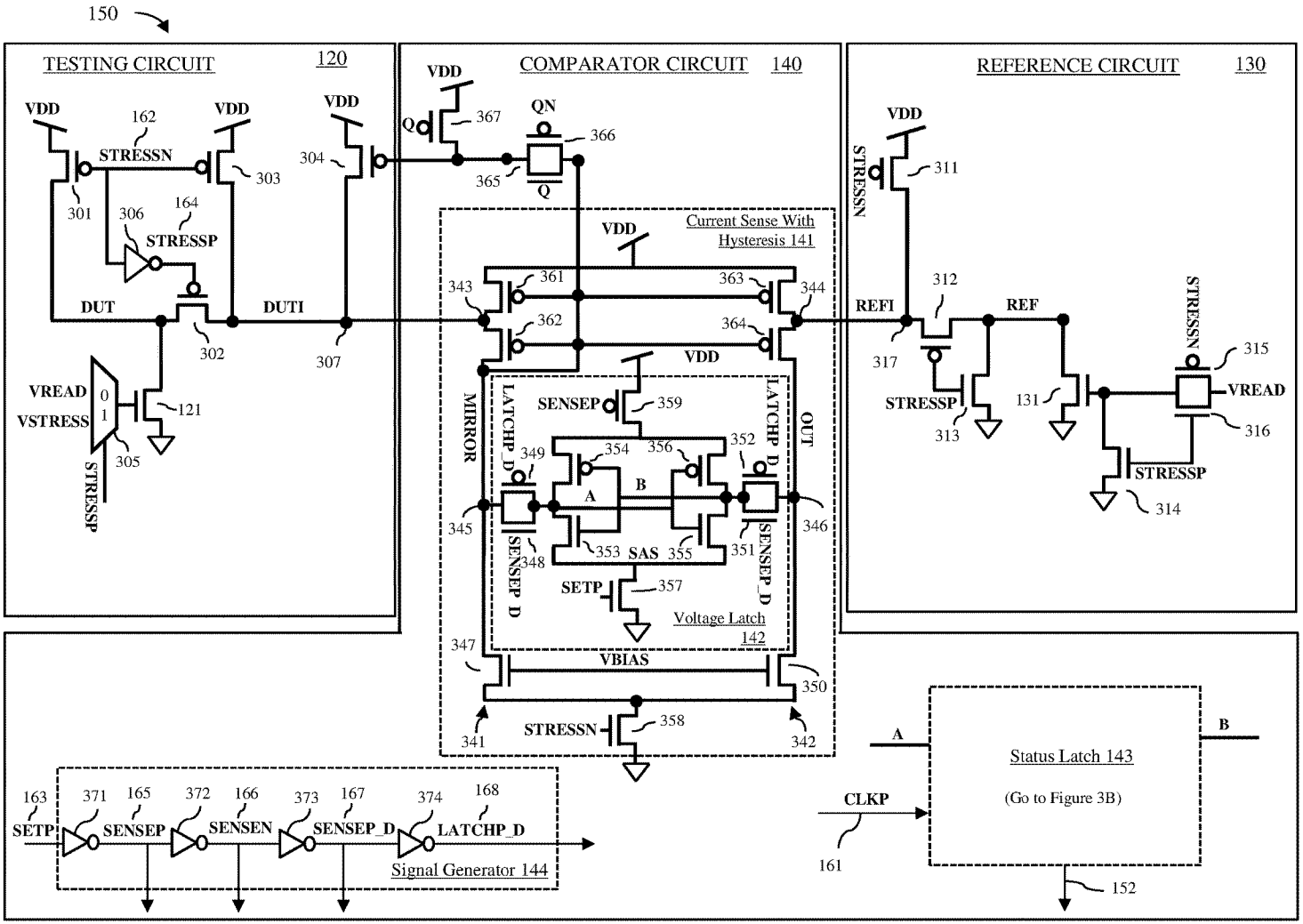
FIG. 3A is a schematic diagram illustrating an exemplary reliability monitor and includes sub-diagrams of an exemplary test circuit, an exemplary reference circuit and an exemplary comparator circuit that can be incorporated into the reliability monitor.
Figure 3B:
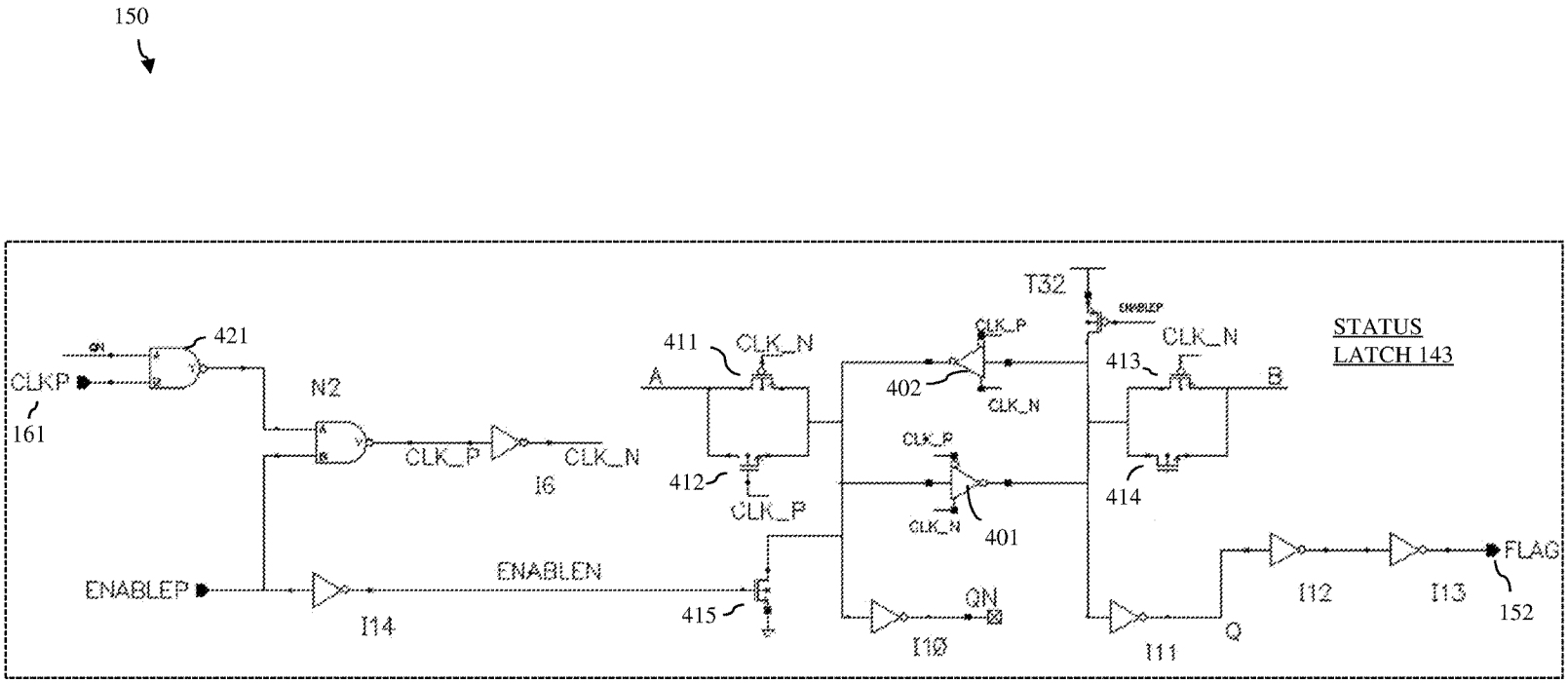
FIG. 3B is a sub-diagram detailing an exemplary status latch that can be incorporated into the comparator circuit of FIG. 3A.

FIG. 3A is a schematic diagram illustrating an exemplary reliability monitor 150 and includes sub-diagrams of an exemplary test circuit 120, an exemplary reference circuit 130 and an exemplary comparator circuit 140 that can be incorporated into the reliability monitor 150. FIG. 3B is a sub-diagram detailing an exemplary status latch 143 that can be incorporated into the comparator circuit 140 of FIG. 3A. FIGS. 3A and 3B also identify various signals that can be used to control the test circuit 120, reference circuit 130 and comparator circuit 140.

For purpose of illustration, the given on-chip functional device 111 to be monitored by this reliability monitor 150 can be an N-type field effect transistor (NFET) (e.g., a current source). During IC chip operations, this NFET can be subjected to specific stress conditions (e.g., specific temperature and/or voltage bias conditions) and these specific stress conditions can make the functional device susceptible to a particular failure mechanism, namely, hot electron injection-induced saturation drain current degradation.

The exemplary test circuit 120 includes a test device 121, which is an NFET that is essentially identical to the functional device to be monitored. Furthermore, the exemplary test circuit 120 can be configured to impart specific stress conditions on the test device 121 over time and specifically when the reliability monitor 150 is enabled and operating in the stress mode. These stress conditions can be essentially the same as those concurrently encountered by the functional device 111 such that the test device 121 is similarly susceptible to hot electron injection-induced saturation drain current degradation. The test circuit 120 can further be configured to remove the stress conditions, when the reliability monitor 150 periodically switches operation to the test mode so as to allow the test device 121 to be tested. Specifically, the exemplary test circuit 120 can further include a plurality of P-type field effect transistors (PFETs) 301-304; an analog voltage multiplexor 305; and an inverter 306. The source of the test device 121 can be electrically connected to ground and the drain of the test device 121 can be electrically connected to the drains of a first PFET 301 and a second PFET 302 (also referred to herein as a pass gate device). Additionally, the source of the second PFET 302 can be electrically connected to the drain of a third PFET 303 (also referred to herein as a pre-charge device) and to the drain of a fourth PFET 304. The sources of the first PFET 301, the third PFET 303 and the fourth PFET 304 can be electrically connected to a first supply voltage (e.g., VDD). The gate of the test device 121 can be selectively connected to a second supply voltage (stress voltage (VSTRESS)) or to a third supply voltage (read voltage (VREAD)) by the multiplexer 305. It should be noted that VSTRESS can be sufficiently high to place the test device 121 in the high stress or overdrive condition during the stress mode (e.g., to 0.55V), whereas the VREAD can be lower than the VSTRESS so that the high stress conditions are removed from the test device 121 during the test mode. The gates of the first PFET 301 and the third PFET 303 can be controlled by the STRESSN clock signal 162, which is output from the timing circuit 160. The inverter 306 can receive and invert the STRESSN clock signal 162, outputting an inverted clock signal 164 (STRESSP) that controls the gate of the second PFET 302.

The timing circuit 160 can be configured so that the STRESSN clock signal 162 generally has a low value that causes the reliability monitor 150 to operate in the stress mode and further so that periodically (i.e., at some desired interval) it switches to a high value and stays high only for some relatively short duration sufficient to allow for the capture of the status of the test device 121 (i.e., to compare the specific performance parameter of the test device 121 and the reference device 131). Since the STRESSP clock signal 164 is inverted as compared to the STRESSN clock signal 162, during the stress mode, the STRESSP clock signal 164 will be high and the STRESSN clock signal 162 will be low; whereas, during the test mode, the STRESSP clock signal 164 will be low and the STRESSN clock signal 162 will be high.

Within the test circuit 120, timing of the multiplexor 305 and the third PFET 303 (the pre-charge device) can be such that, during the stress mode, the test node 307 (DUTI) of the test circuit 120 at the drains of the third PFET 303 and fourth PFET 304 and at the source of the second PFET 302 can be held at the first supply voltage (VDD) and the test device 121 can be biased with VSTRESS (e.g., 0.55V) on its gate and about 0.8V drain to source in order to mimic the bias conditions of the on-chip functional device 111. During the test mode, the aforementioned high stress condition can be shut off and, specifically, the third PFET 303 (i.e., the pre-charge device) can be shut off, VREAD can be applied to the gate of the test device 121, and the current at the drain of the test device 121 can be coupled to the test node 307 (DUTI) of the test circuit 120 by the second PFET 302 (the pass gate device).

The reference device 131 of the reference circuit 130, as shown in FIG. 3A, is also an NFET that is essentially identical to the functional device 111 at issue and, thus, also essentially identical to the test device 121. The reference circuit 130 can further be configured so that the reference device 131 is not susceptible to hot electron injection-induced saturation drain current degradation. For example, in addition to the reference device 131, the reference circuit 130 can include a PFET 311 (also referred to herein as a pre-charge device), another PFET 312 (also referred to herein as a pass gate device) and an NFET 313 electrically connected in series between the first supply voltage (VDD) and ground. The reference circuit 130 can also include a reference node 317 (REFI) at the interface between the PFET 311 and the PFET 312. The gate of the PFET 311 can be controlled by the STRESSN clock signal 162 and the gates of the PFET 312 and NFET 313 can be controlled by the STRESSP clock signal 164. The source of the reference device 131 can be electrically connected to ground and the drain of the reference device 131 can be electrically connected to a node at the drains of the PFET 312 and NFET 313. The reference circuit 130 can further include a multiplexor and another NFET 314. The gate of the reference device 131 can be electrically connected to the drain of the NFET 314. The source of the NFET 314 can be electrically connected to ground and the gate of the NFET 314 can be controlled by the STRESSP clock signal 164. The gate of the reference device 131 can further be selectively connected to a fourth supply voltage (VREAD+ΔV) by the multiplexor, which includes coupled P-type and N-type pass gate FETs 315-316 that are controlled by the STRESSN clock signal 162 and STRESSP clock signal 164, respectively. The fourth supply voltage can be equal to the third supply voltage (VREAD), plus a voltage adder. The voltage adder can correspond to the change in current (ΔI) that is known or expected to occur at the drain of the test device 121 when the predetermined threshold amount of saturation drain current degradation occurs, thereby indicating that a given number of power-on-hours (POHs) has passed.

During the test mode, controlling the gate of the test device 121 with the third supply voltage (VREAD) and the reference device 131 with the fourth supply voltage, which is equal to the third supply voltage plus the voltage adder (VREAD+ΔV), ensures that status signal 152 will stay low until a device degradation in test device 121 is sufficient to reduce its drain current below the drain current of reference device 131. When the drain current of test device 121 becomes less than the drain current of reference device 131, status signal 152 will switch high to indicate a given number of power-on-hours (POHs) has passed.

As mentioned above, during the stress mode, the STRESSP clock signal 164 will be high and the STRESSN clock signal 162 will be low; whereas, during the test mode, the STRESSP clock signal 164 will be low and the STRESSN clock signal 162 will be high. Thus, during the stress mode, the reference node 317 (REFI) of the reference circuit 130 will be pre-charged to the first supply voltage (VDD) by the PFET 311 (the pre-charge device) and the reference device 131 will have a 0-Volt bias on the gate and, thus, will be unstressed. As a result, the reference device 131 will maintain its intrinsic strength throughout the life of the IC chip 100. During the test mode, VREAD+ΔV will be applied to the gate of reference device 131 by the adjacent multiplexor and the current at the drain of the reference device 131 will be coupled to the reference node 317 of the reference circuit 130 through PFET 312 (the pass gate device).

The comparator circuit 140 can include: a current mirror 141 with hysteresis (also referred to herein as a current sense with hysteresis); a voltage latch 142; a status latch 143; and an internal signal generator 144.

The current mirror 141 can specifically be a cascaded mirror circuit that includes a first leg 341 and a second leg 342, each of which are connected through an N-type field effect transistor (NFET) 358 (i.e., a foot device) to ground at one end and to the first supply voltage (VDD) at the opposite end. The first leg 341 can include two p-type field effect transistors (PFETs) 361-362 and an NFET 347 (also referred to herein as a current source) connected in series between the first supply voltage (VDD) and the NFET 358. The second leg 342 can similarly include two PFETs 363-364 and an NFET 350 (also referred to herein as a current source) connected in series between the first supply voltage (VDD) and the NFET 358. The gates of the NFETs 347 and 350 (i.e., of the current sources at the bottom of each leg) can be electrically connected to a fifth supply voltage (bias gate voltage (VBIAS)). The first leg 341 can include a pair of first nodes 343 and 345. One first node 343 can be located at the junction between the PFETs 361-362 and can be coupled to the test node 307 of the test circuit 120. The other first node 345 (MIRROR) can be located at the junction between the PFET 362 and the NFET 347 and, as discussed in greater detail below, can be coupled to the voltage latch 142. The second leg 342 can have a pair of second nodes 344 and 346. One second node 344 can be located at the junction between the PFETs 363-364 and can be coupled to the reference circuit 130 at the reference node 317 of the reference circuit 130. The other second node 346 (OUT) can be located at the junction between the PFET 364 and the NFET 350 and, as discussed in greater detail below, can be coupled to the voltage latch 142. The gates of the PFETs 361-364 and the first node 345 (MIRROR) of the first leg 341 can all be identically biased during the different modes by means of a current source (e.g., PFET 367), which is coupled to the gates of the PFETs 361-364 and to the output node 345 through an adjacent multiplexor (e.g., through the coupled N-type and P-type pass gate FETs 365-366).

The voltage latch 142 can be a voltage sense amplifier, which includes a pair of cross-coupled inverters. The cross-coupled inverters can include a first inverter (PFET 354 connected in series to an NFET 353) and a second inverter (PFET 356 connected in series to an NFET 355). Each inverter can be electrically connected at one end to the first supply voltage (VDD) through a PFET 359 and at the opposite end to ground through an NFET 357. A sense node A at the interface between the PFET 354 and NFET 353 of the first inverter can control the gates of the PFET 356 and NFET 355 in the second inverter and can further be electrically connected to the first node 345 (MIRROR) of the first leg 341 of the current mirror 141 through an adjacent multiplexor (e.g., through the coupled N-type and P-type pass gate FETs 348-349). Another sense node B at the interface between the PFET 356 and NFET 355 of the second inverter can control the gates of the PFET 354 and the NFET 353 of the first inverter and can be electrically connected to the second node 346 (OUT) of the second leg 342 of the current mirror 141 through an adjacent multiplexor (e.g., through the coupled N-type and P-type pass gate FETs 351-352).

The status latch 143 can be a sample and hold latch that is coupled to both the sense node A and the sense node B of the voltage latch 142. FIG. 3B is a schematic diagram illustrating an exemplary status latch 143 that can be incorporated into the comparator circuit 140. As illustrated, this status latch 143 includes a tri-state inverter, which is a latch formed from inverters 401 and 402 and pass gate FETs 411-415.

As mentioned above, during the stress mode, the STRESSP clock signal 164 will be high and the STRESSN clock signal 162 will be low; whereas, during the test mode, the STRESSP clock signal 164 will be low and the STRESSN clock signal 162 will be high.

Thus, during the stress condition, the NFET 358 (foot device) of the current mirror 141 can be turned off so that the internal nodes float to VDD or slightly below. However, during the test mode, the NFETs 347 and 350 (current sources) at the bottoms of the first leg 341 and the second leg 342, respectively, of the current mirror 141 will be biased by the bias gate voltage (VBIAS) in order to provide a small current through the PFETs 361-362 in the first leg 341 of the current mirror 141 and also through the PFETs 363-364 in the second leg 342 of the current mirror 141. As a result, a test current will flow through the PFET 361 and the node 343 of the first leg 341 and into the test circuit 120 to the drain of the test device 121. The first leg 341 of the current mirror 141 will sense this test current and will output an analog test voltage at the node 345 (MIRROR). Additionally, a reference current will flow through the PFET 363 and the node 344 of the second leg 342 and into the reference circuit 130 to the drain of the reference device 131. The second leg 342 of the current mirror 141 will sense the reference current and will output an analog reference voltage at the node 346 (OUT).

During the test mode, the voltage latch 142 will sense the analog test voltage at the node 345 (MIRROR) and the analog reference voltage at the node 346 (OUT) and will further convert the analog test voltage to a digital test voltage at sense node A and the analog reference voltage to a digital reference voltage at sense node B. More specifically, the SETP clock signal 163, which like the STRESSN clock signal 162 is output by the timing circuit 160, can control the NFET 357 and can further be provided as an input to a signal generator 144, which includes multiple series-connected inverters 371-374 for internally generating the following signals: pass gate signal 165 (SENSEP), pass gate signal 166 (SENSEN), latch signal 167 (SENSEP_D) and latch signal 168 (LATCHP_D), in sequence. The timing circuit 160 can further be configured to ensure that the SETP clock signal 163 will go high a short interval after the STRESSN clock signal 162 goes high and, thereby after the reliability monitor has entered the test mode. This causes the analog test voltage on the node 345 (MIRROR) of the first leg 341 of the current mirror 141 and the analog reference voltage on the node 346 (OUT) of the second leg 342 of the current mirror 141 to pass to the sense nodes A and B, respectively, of the voltage latch 142. Upon firing of the latch signals SENSEP_D and LATCHP_D 167-168, the voltage latch 142 will latch the voltage difference between A and B either low or high (i.e., to logic value '0' or '1').

Additionally, during the test mode, the states of the sense nodes A and B of the voltage latch 142 are passed to the status latch 143. The status latch 143 senses the digital test voltage and the digital reference voltage on sense nodes A and B, respectively, and outputs the status signal based on the difference between those voltages. Specifically, referring to FIG. 3B, the enable signal (ENABLEP) initializes the latch so that output node Q is low and, thus, so that the status signal 152 is low (i.e., at logic value '0') shortly after power-on and before a full cycle of CLKP clock signal 161 occurs. The voltage levels on the sense nodes A and B are latched when the CLKP clock signal 161 goes low. The status latch 143 is further configured with clock inhibiting logic such that once the test device 121 weakens to the point where the status latch 143 detects that sense node B is low and sense node A is high, further clock signals are fenced off so as to maintain the latched state with output node Q going high (i.e., to a logic value '1') and status signal 152 (flag) also switching from low to high (i.e., switching from logic value '0' to logic value '1'), thereby indicating that the test device 121 has been under stress long enough to show a degradation. Additionally, when the output node Q goes high, the output node QN will go low. This locks the NAND gate 421 so that its output is low (i.e., a logic value of '0') and keeps the clock signal CLKP low (i.e., at a logic value of '0') to prevent further changes to the status latch state.

Furthermore, when the output node Q goes high, the hysteresis function of current mirror 141 is enabled. Specifically, hysteresis is activated once the output node Q switches from low to high and, thus, when the status signal 152 has also switched values from low to high. Hysteresis alters the balance within the current mirror 141 in favor of sensing that the difference in the saturation drain current between the test device 121 and the reference device 131 is above the predetermined threshold amount. Doing this prevents noises from causing the analog test voltage and the analog reference voltages on the nodes 345 and 346 of the current mirror 141, respectively, to chatter and glitch at the onset of the test mode. Hysteresis continues to provide such noise immunity in order to ensure that the status signal 152 (flag) remains high for as long as the IC chip 100 is powered on. Furthermore, the state of status signal 152 will be maintained even when the power is cycled (i.e., even when the supply VDD is removed from the circuitry and subsequently restored). That is, the state of the status signal 152 (flag), which is output by the status latch 143, will be reset to its last held state when the IC chip is powered off and back on again.

Figure 4:
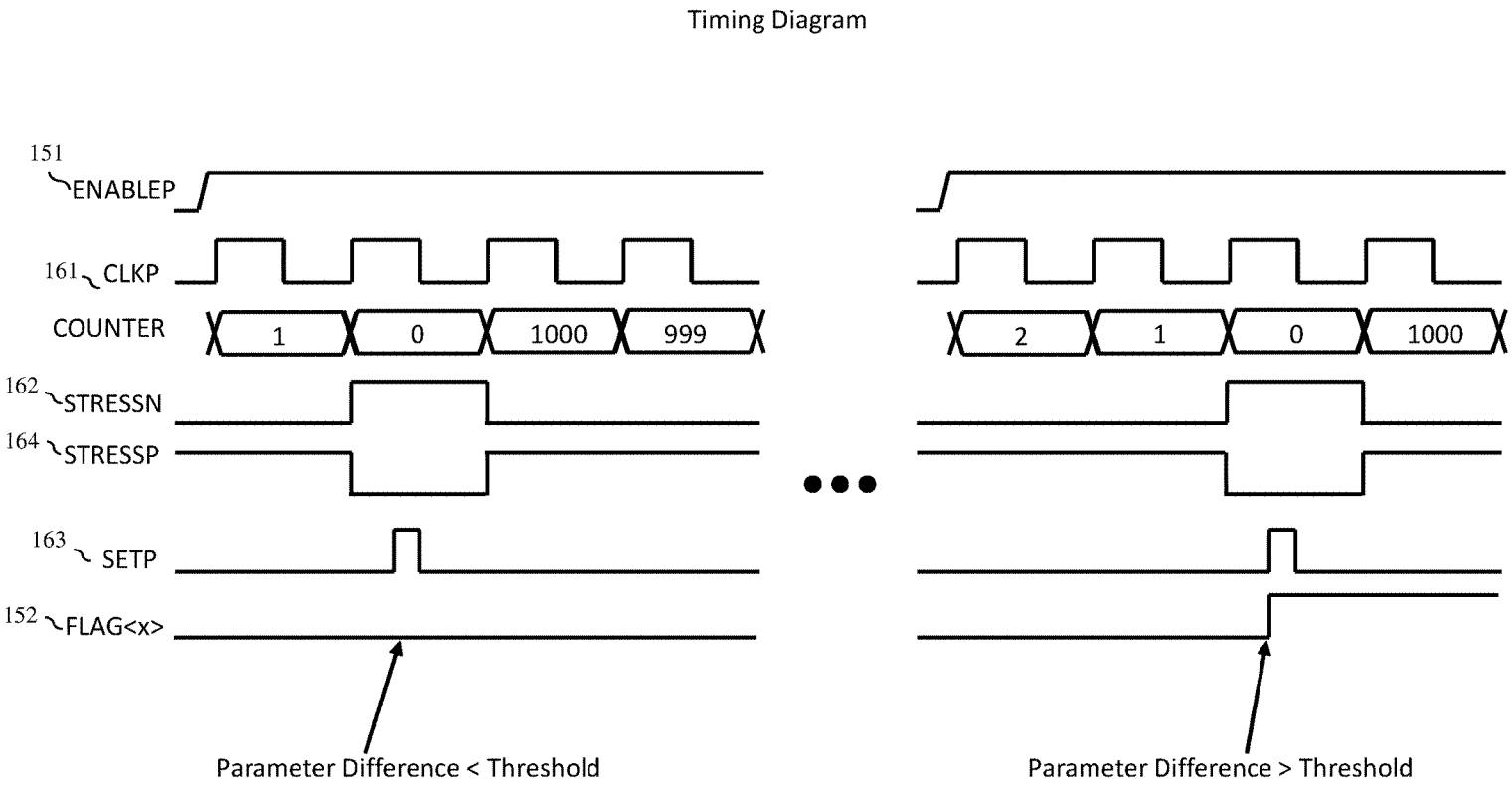
FIG. 4 is a timing diagram for the reliability monitor shown in FIGS. 3A-3B.

FIG. 4 is an exemplary timing diagram illustrating the timing of some of the signals, which, as discussed above, control operation of the reliability monitor 150 shown in FIGS. 3A-3B.

The initial enable signal 151 can be automatically set high (i.e., at a logic value of '1') when the IC chip 100 is powered on. This enable signal ENABLEP enables the comparator circuitry and, particularly, allows the reliability monitor 150 to periodically switch from operation in a stress mode to operation in a test mode and back again.

As mentioned above, the timing circuit 160 can receive the CLKP clock signal 161 and, based on the CLKP clock signal 161, can output both a STRESSN clock signal 162 and a SETP clock signal 163. These three clock signal 161-163 can be received by the reliability monitor 150 and, in conjunction with several internally generated signals (e.g., signals 164-168), can control the timing of the various components 120, 130 and 140 of the reliability monitor 150 so that operation periodically switches to the test mode, so that the duration of the test mode is sufficient to allow for capture of the status of the test device 121 (i.e., to compare the specific performance parameter of the test device 121 and the reference device 131) and so that the reliability monitor 150 otherwise operates in the stress mode.

The CLKP clock signal 161 can be a free running clock signal that oscillates at some desired frequency. The timing circuit 160 can include an N-bit counter as well as control logic. The N-bit counter can be set to translate the frequency of the CLKP clock signal 161 to a desired interval to be used to periodically test the test device 121 (i.e., to periodically switch operation of the reliability monitor 150 from the stress mode to the test mode and back). For example, it may be desirable to test the test device 121 every 1 us, for a 1 GHz clock (i.e., Ins clock period). In this case, the N-bit counter could be set to 1000 such that the reliability monitor switches from the stress mode to the test mode whenever the counter decrements to 0 after 1000 clock pulses (1000*1 ns=1 us). When the counter reaches 0 (i.e., when COUNTER=0), the control logic will cause the STRESSN clock signal 162 to go high. This, in turn, will cause the STRESSP clock signal 164 to go low (i.e., to a logic value of '0') and, thereby cause the reliability monitor 150 to enter the test mode during which the high stress conditions are removed from the test device 121 and the comparison between the parameters of the test device 121 and reference device 131 is initiated. The control logic can further cause the SETP clock signal 163 to go high a short interval after the STRESSN clock signal 162 goes high and to go low again before the STRESSN clock signal 162 goes back to low. A high SETP clock signal will cause the comparator circuit 140 to latch the differential current between test device 121 and the reference device 131 and output the status signal 152 (flag). If the difference in the parameter at issue (e.g., saturation drain current) between the test device 121 and the reference device 131 is below the predetermined threshold amount, the status signal 152 will remain low (see the left side of the timing diagram); however, when the difference becomes greater than the predetermined threshold amount, the status signal will switch from low to high (see the right side of the timing diagram).

Figure 5:
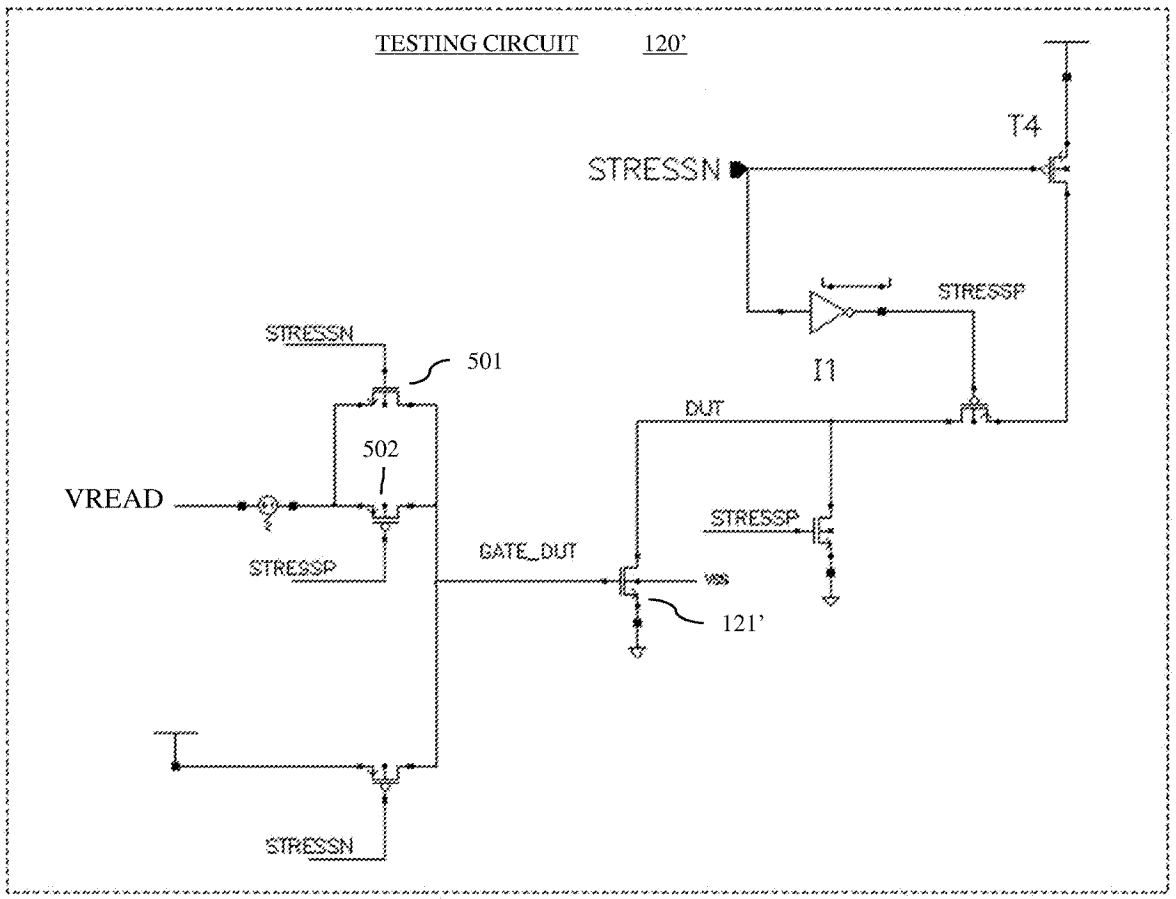
FIG. 5 is a schematic diagram illustrating an alternative test circuit that can be incorporated into the reliability monitor of FIG. 3A.

It should be noted that the exemplary circuitry described above and illustrated in FIGS. 3A-3B is not intended to be limiting. For example, the reliability monitor 150 could be configured with a different test circuit 120', as shown in FIG. 5, in order to monitor a different on-chip functional device (e.g., a different NFET), which is subjected to different stress conditions that make the functional device susceptible to a different failure mechanism such as positive bias temperature instability (PBTI) hot electron injection-induced saturation drain current degradation. In this case, the exemplary test circuit 120' would replace the test circuit 120 shown in FIG. 3A. The test circuit 120' includes a test device 121', which is an NFET that is essentially identical to the functional device to be monitored. As with the previously described test circuit 120, the exemplary test circuit 120' can be configured to impart specific stress conditions on the test device 121' over time and specifically when the reliability monitor 150 is enabled and operating in the stress mode. These stress conditions can be essentially the same as those concurrently encountered by the functional device 111 such that the test device 121' is similarly susceptible to PBTI. Specifically, during the stress mode, the test device 121' can be biased in inversion so as to be susceptible to PBTI. A multiplexor and, particularly, coupled N-type and P-type pass gate FETs 501-502 that are controlled by clock signals STRESSN and STRESSP, respectively, can be connected to the gate of the test device 121. During the test mode, the multiplexor can apply the gate voltage VREAD to the gate of the test device 121', thereby biasing device 121' in the saturated region for testing and, particularly, for comparison to the reference device 131.

As mentioned above, and illustrated in FIG. 1, a single reliability monitor 150 could be used on an IC chip 100 with the status signal 152 (i.e., the flag) indicating whether or not the predicted EOL has been reached. However, optionally, when EOL parameter shifts are small and difficult to detect, multiple essentially identical reliability monitors $\mathbf{150}_{1\text{-}n}$ can be cascaded together in order to more accurately monitor stress-induced changes particularly near EOL.

Figure 6:
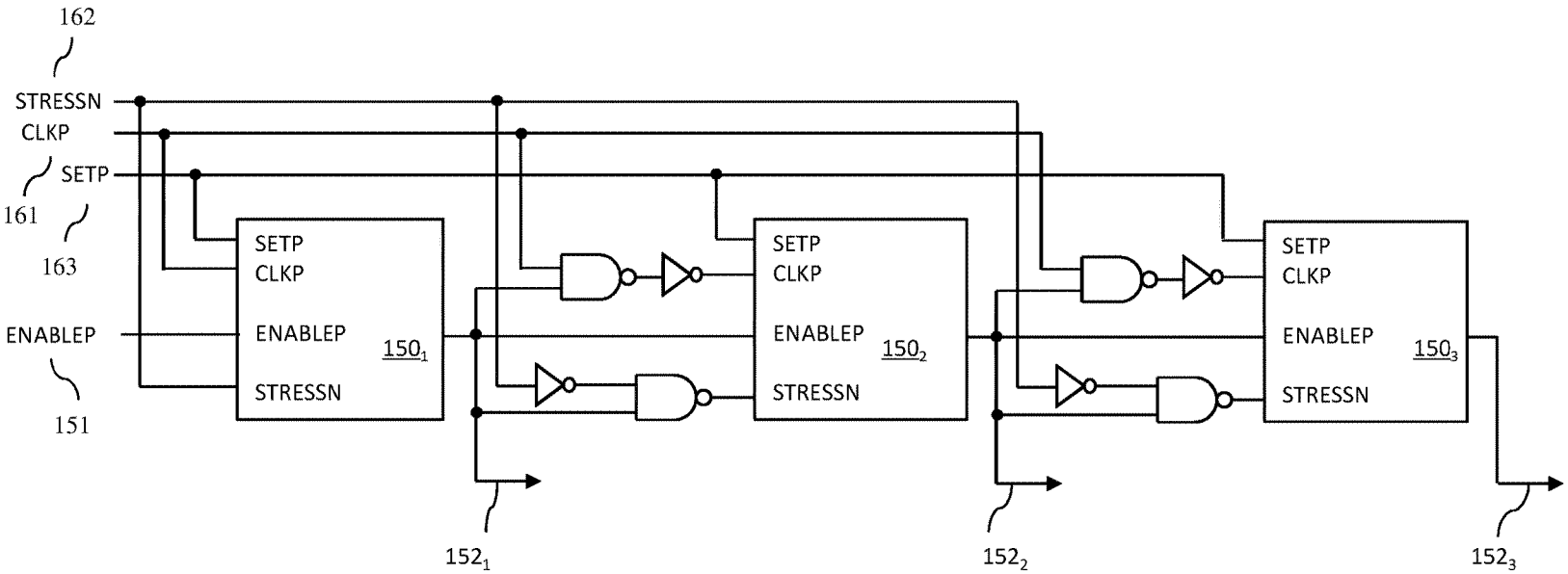
FIG. 6 is schematic diagram illustrating multiple cascaded reliability monitors.

FIG. 6 is a circuit diagram illustrating, in greater detail, three such cascaded reliability monitors $\mathbf{150}_{1\text{-}3}$. As illustrated, the cascaded reliability monitors $\mathbf{150}_{1\text{-}3}$ include a first reliability monitor $\mathbf{150}_1$ that is enabled by an initial enable signal 151 ENABLEP, when the ENABLEP signal goes high. When the first reliability monitor $\mathbf{150}_1$ is enabled, the CLKP, STRESSN, and SETP signals cause the first reliability monitor $\mathbf{150}_1$ to periodically switch operation between the stress and test modes and to output a status signal 1521 that eventually switches from low to high indicating that the initial X POHs (e.g., 10,000 POHs) have been reached. The cascaded reliability monitors $\mathbf{150}_{1\text{-}3}$ further include a second reliability monitor $\mathbf{150}_2$ that receives the status signal 1521 from the first reliability monitor $\mathbf{150}_1$ and that is enabled only when the status signal 1521 has gone high. In other words, the status signal 1521 functions as the enable signal ENABLEP for the second reliability monitor $\mathbf{150}_2$. When the second reliability monitor $\mathbf{150}_2$ is enabled, the CLKP, STRESSN, and SETP signals cause the second reliability monitor $\mathbf{150}_2$ to periodically switch operation between the stress and test modes and to output a status signal $\mathbf{152}_2$ that eventually switches from low to high indicating that the 2X POHs (e.g., 20,000 POHs) have been reached. The cascaded reliability monitors $\mathbf{150}_{1\text{-}3}$ further include a third reliability monitor $\mathbf{150}_3$ that receives the status signal $\mathbf{152}_2$ from the second reliability monitor $\mathbf{150}_2$ and that is enabled only when the status signal $\mathbf{152}_2$ has gone high. In other words, the status signal $\mathbf{152}_3$ functions as the enable signal ENABLEP for the third reliability monitor $\mathbf{150}_3$. When the third reliability monitor $\mathbf{150}_3$ is enabled, the CLKP, STRESSN, and SETP signals cause the third reliability monitor $150_3$ to periodically switch operation between the stress modes and test modes and to output a status signal $152_3$ that eventually switches from low to high indicating that the 3X POHs (e.g., 30,000 POHs) and the predicted EOL of the IC chip 100 have been reached. See also the timing diagram of FIG. 4 and the detailed discussion above with regard to the various signal values necessary to cause the switching of reliability monitor operation from the stress mode to the test mode and back.

Figure 7:
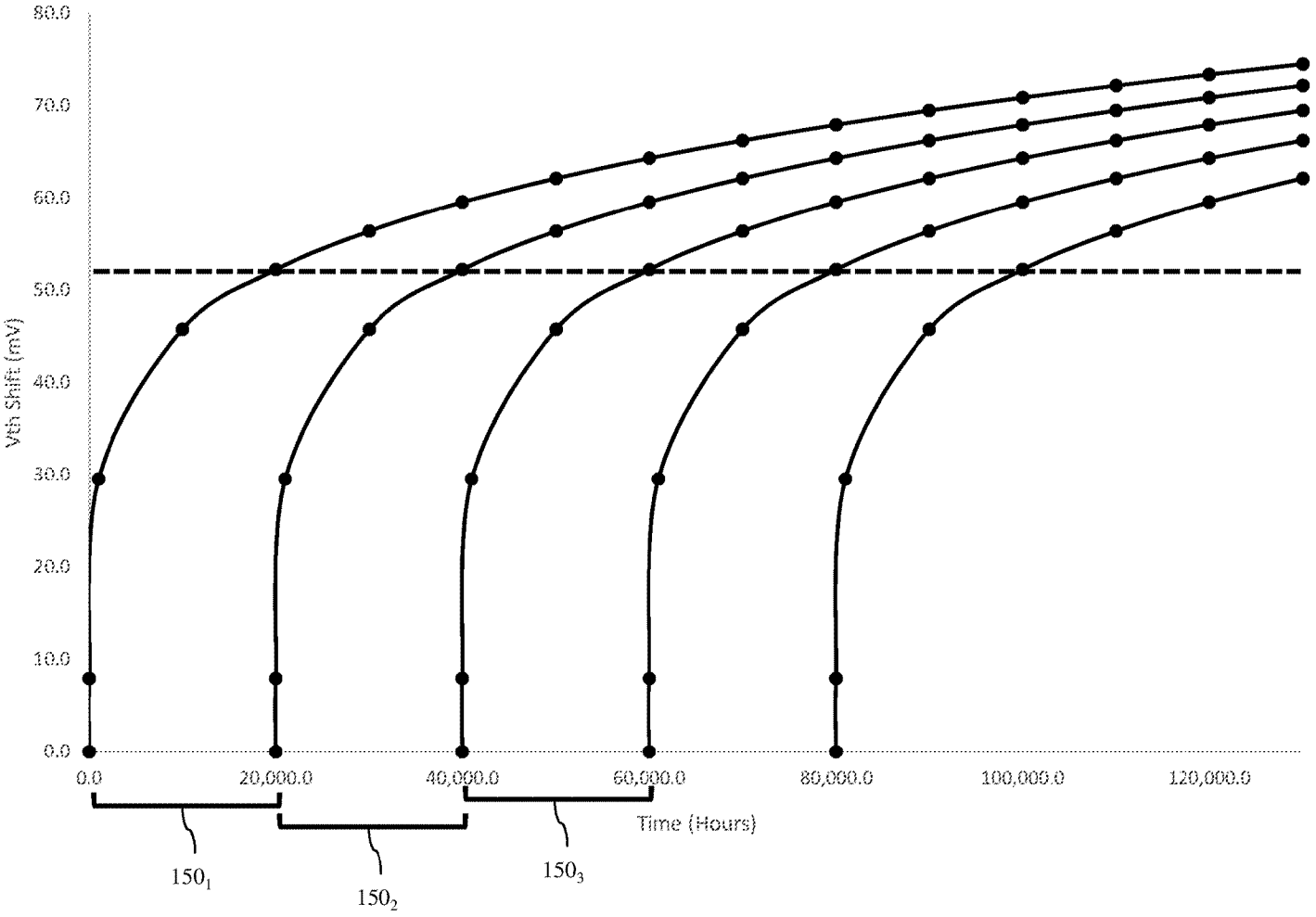
FIG. 7 is a graph with discrete curves illustrating exemplary threshold voltage shifts exhibited by test device in each of multiple cascaded reliability monitors.

FIG. 7 is a graph with discrete curves illustrating the threshold voltage shifts exhibited by the test devices in each of the cascaded reliability monitors $150_{1\text{-}3}$. These curves show that the threshold voltage shifts do not occur until after the given reliability monitor is enabled and that in each case the threshold voltage shifts are initially very large, but the rate of change decreases dramatically after approximately 20,000 POHs. With the configuration shown in FIG. 6, since the test device in the third reliability monitor $150_3$ is only subjected to stress conditions during the last X POHs of the IC chip 100, it will exhibit a relatively large change in the performance parameter. This relatively large change can be readily detected and will occur concurrently with a relatively small change in the performance parameter of the on-chip functional device at issue near its EOL. Thus, only when the status signal $152_3$ switches values (e.g., from low to high, from logic value '0' to '1') will the functional circuit be deemed no longer reliability and the IC chip 100 be deemed to have reached the EOL.

Figure 8:
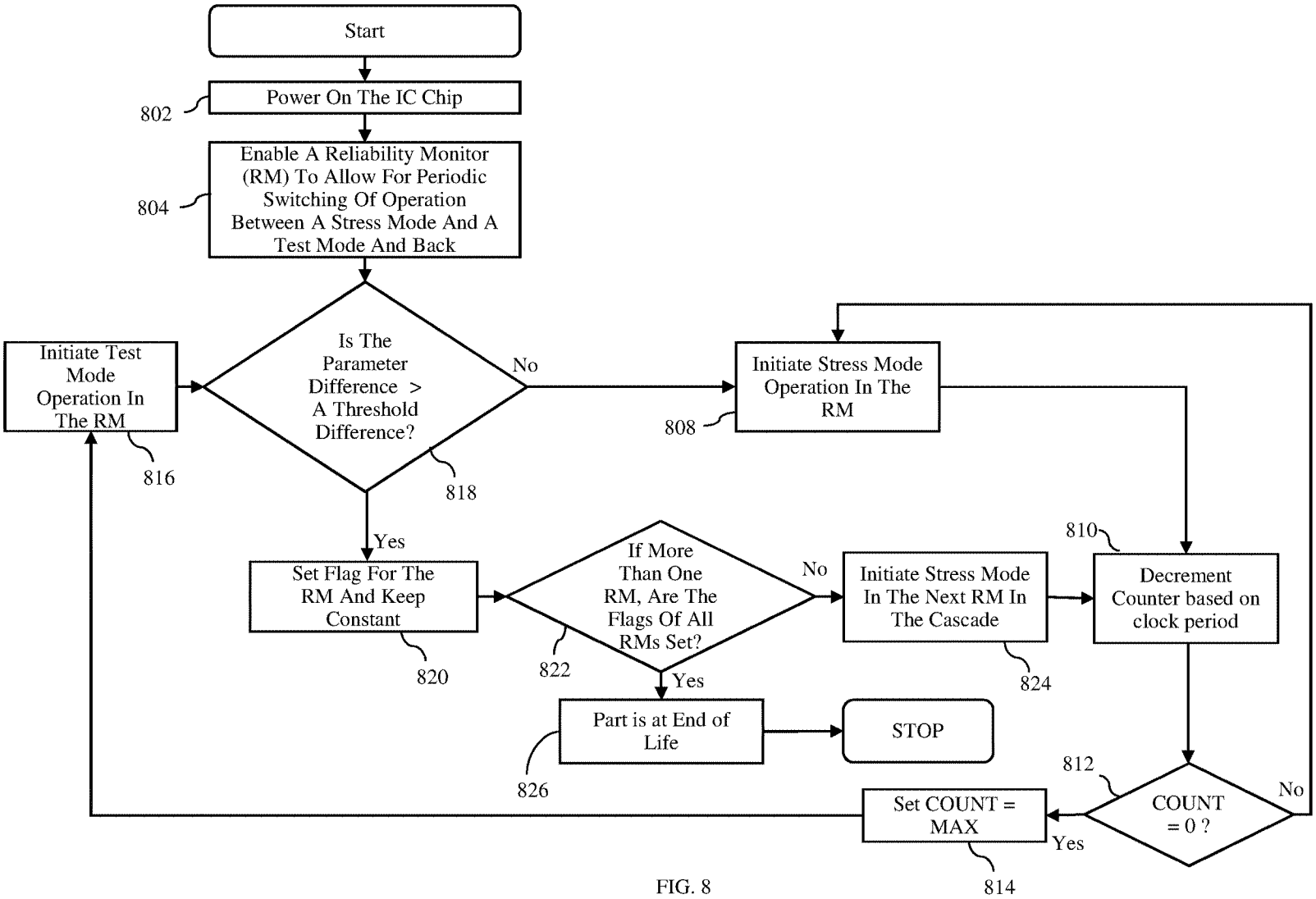
FIG. 8 is a flow diagram illustrating a reliability monitoring method.

Also disclosed herein is a reliability monitoring method for a functional device on an integrated circuit (IC) chip and, thereby for the IC chip. Referring to the flow diagram of FIG. 8 in combination with FIGS. 1-7 above, the method can include providing an IC chip 100 that includes, on a substrate 101, a functional device 111, one or more reliability monitors $150_{1\text{-}3}$ for the functional device 111, and a timing circuit 160 for controlling the timing of the various components of the reliability monitor(s) $150_{1\text{-}3}$, as discussed in detail above with regard to the structure embodiments.

The method can further include powering on the IC chip 100 (see process 802) and, after powering on the IC chip 100, enabling a reliability monitor 150 and using clock signals to control the reliability monitor 150 so that the reliability monitor alternatingly operates in stress and test modes (i.e., so that the reliability monitor 150 periodically switches from operation in a stress mode to operation in a test mode and back, when the IC chip is powered on) (see process 804). Operating the reliability monitor 150 in the stress mode (see process 808) includes subjecting a test device 121 of a test circuit 120 of the reliability monitor 150 to stress conditions that emulate the operating conditions of a given on-chip functional device 111. For example, in one embodiment, the functional device 111 and the test device 121 of the exemplary test circuit 120 (see FIG. 3A) can be essentially identical NFETs, the functional device 111 can be susceptible to hot electron injection-induced saturation drain current degradation and, during the stress mode, the stress conditions bias the test device 121 such that it is similarly susceptible to hot electron injection-induced saturation drain current degradation. In another embodiment, the functional device 111 and the test device 121' of the exemplary test circuit 120' (see FIG. 5) can also be essentially identical NFETs; however, in this case the functional device 111 can be susceptible to positive bias temperature instability (PBTI) and the stress conditions bias the test device 121' in inversion so that the test device is similarly susceptible to PBTI. It should be noted that, during the stress mode, a reference device 131 of a reference circuit 130 of the reliability monitor 150 remains unstressed. In any case, the reliability monitor 150 can continue to operate in the stress mode for some regular interval, which is set by the timing circuit 160 and, particularly, by decrementing a counter based on a clock period (see process 810). As long as the counter is still counting down (i.e., has not reached 0), the reliability monitor can continue to operate in the stress mode (see process 812).

Once the counter counts down to 0, it can be reset (see process 814) and operation of the reliability monitor can be switched to the test mode (see process 816). Operating the reliability monitor 150 in the test mode at process 816 includes removing the stress conditions from the test device 121, comparing a test parameter of the test device 121 to a reference parameter of the reference device 131 (see process 818) and outputting a status signal 152 based on a difference between the test parameter and the reference parameter. The process 818 of comparing a test parameter of the test device 121 to a reference parameter of a reference device 131 can include, for example: generating an analog test voltage based on a test current flowing to the test device 121 and generating an analog reference voltage based on a reference current flowing to the reference device 131; converting the analog test voltage to a digital test voltage and converting the analog reference voltage to a digital reference voltage; and either keeping the value of the status signal 152 low when the digital test voltage is the same as the digital reference voltage or switching the value of the status signal 152 to high when the digital test voltage is different from the digital reference voltage. Specifically, a finding at process 818 that the digital test voltage and the digital reference voltage are the same indicates that the difference between the test parameter and the reference parameter is below a predetermined threshold amount. Thus, the value of the status signal 152 will remain low and operation of the reliability monitor 150 in the stress mode can again be initiated at process 808. However, a finding at process 818 that the digital test voltage and the digital reference voltage are different indicates that the difference between the test parameter and the reference parameter is above the predetermined threshold amount at process 818. Thus, the value of the status signal 152 will be switched (e.g., from low to high), thereby setting the flag for that reliability monitor 150 (see process 820). The method can further include ensuring that this status signal 152 remains constant, once it is switched to high at process 820. This switch in the value of the status signal 152 will be indicative of the on-chip functional device 111 being powered on for some predetermined number of hours (e.g., for X power-on hours (POHs)).

If this is the only reliability monitor on the IC chip 100, then a determination can be made that the IC chip is at EOL (see processes 822 and 826). However, if, as illustrated in FIGS. 1 and 6, the IC chip 100 includes multiple cascaded reliability monitors $150_{1\text{-}3}$ (e.g., at least a first reliability monitor $150_1$, a second reliability monitor $150_2$ coupled to the first reliability monitor $150_1$, and so on) and if not all flags of all reliability monitors have been set, operation of the next reliability monitor in the cascade of reliability monitors $150_{1\text{-}3}$ can be initiated (see processes 822 and 824). In this case, the method can include using an initial enable signal 151 to enable the first reliability monitor $150_1$ such that the first reliability monitor $150_1$ alternatingly operates in the stress and test modes. The method can further include using the status signal 1521 output by the first reliability monitor $150_1$ to enable the second reliability monitor $150_2$. That is, the method can include, when the status signal 1521 output from the first reliability monitor $\mathbf{150}_1$ switches values, automatically enabling the second reliability monitor $\mathbf{150}_2$ so that the second reliability monitor $\mathbf{150}_2$ alternatingly operates in the stress and test modes. In this case, the switch in the values of the status signal 1521 output by the first reliability monitor $\mathbf{150}_1$ (e.g., from low to high, 0 to 1) will be indicative of the on-chip functional device being powered on for some predetermined number of hours (e.g., for X power-on hours (POHs)). A subsequent switch in values of the status signal $\mathbf{152}_2$ output by the second reliability monitor $\mathbf{150}_2$ (e.g., from low to high, 0 to 1) will be indicative of the on-chip functional device being powered on for another X power-on hours (POHs) (i.e., for 2X power-on hours). Optionally, the method can further include using the status signal $\mathbf{152}_2$ output by the second reliability monitor $\mathbf{150}_2$ to enable a third reliability monitor $\mathbf{150}_3$. That is, the method can further include, when the status signal $\mathbf{152}_2$ output from the second reliability monitor $\mathbf{150}_2$ switches values, automatically enabling a third reliability monitor $\mathbf{150}_3$ so that the third reliability monitor $\mathbf{150}_3$ alternatingly operates in the stress and test modes. A subsequent switch in values of the status signal $\mathbf{152}_3$ output by the third reliability monitor $\mathbf{150}_3$ (e.g., from low to high, 0 to 1) will be indicative of the on-chip functional device being powered on for yet another X power-on hours (POHs) (i.e., for 3X power-on hours). In this case, only when it is determined at process 822 that all flags of all reliability monitors in a cascade of reliability monitors have been set, will the IC chip be determined to be at EOL at process 826.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit chip comprising:

a substrate; and a reliability monitor on the substrate and comprising:

a test circuit comprising a test device;

a reference circuit comprising a reference device*; wherein the test device and the reference device are duplicates of a function device of the integrated circuit chip*; and a comparator circuit connected to the test circuit and the reference circuit, wherein, when the integrated circuit chip is powered on, the reliability monitor is alternatingly operable in stress and test modes, wherein, during each stress mode, the test device is subjected to stress conditions that emulate operating conditions of [a] *the* functional device and the reference device is unstressed, [and]

wherein, during each test mode, the stress conditions are removed from the test device and the comparator circuit compares a test parameter of the test device to a reference parameter of the reference device and outputs a status signal based on a difference between the test parameter and the reference parameter*, and when the status signal output by the reliability monitor switches values, a second reliability monitor on the integrated circuit chip is enabled so that the second reliability monitor alternatingly operates in stress and test modes*.

2. The integrated circuit chip of claim 1, wherein, when the difference between the test parameter and the reference parameter reaches a predetermined threshold amount, during a test mode, the status signal switches value, wherein, after switching values, the status signal remains constant, and wherein, when the integrated circuit chip is powered off and back on, the status signal is automatically reset to a last held value.

3. The integrated circuit chip of claim 1, wherein operation of the reliability monitor is controlled by clock signals when the integrated circuit chip is powered on such that the reliability monitor periodically switches operation from a stress mode to a test mode and back.

4. The integrated circuit chip of claim 1, wherein the comparator circuit comprises:

a current mirror;

a voltage latch; and a status latch, wherein the current mirror comprises:

a first leg comprising first nodes coupled to the test circuit and the voltage latch, respectively, such that, during a test mode, a first current flows through one first node to the test device and such that an analog test voltage is exhibited at another first node; and a second leg comprising second nodes coupled to the reference circuit and the voltage latch, respectively, such that, during the test mode, a second current flows through one second node to the reference device and such that an analog reference voltage is exhibited at another second node, wherein the voltage latch senses the analog test voltage and the analog reference voltage and converts the analog test voltage to a digital test voltage and the analog reference voltage to a digital reference voltage, and wherein the status latch senses the digital test voltage and the digital reference voltage and outputs the status signal based on the digital test voltage and the digital reference voltage.

5. The integrated circuit chip of claim 4, wherein the current mirror has a hysteresis function enabled by the status signal.

6. The integrated circuit chip of claim 1, wherein the test circuit comprises:

an N-type field effect transistor comprising the test device;

a multiplexer; and a plurality of P-type field effect transistors, wherein the stress conditions bias the test device so that the test device is susceptible to hot electron injection-induced saturation drain current degradation, wherein a source of the N-type field effect transistor is electrically connected to ground and a drain of the N-type field effect transistor is electrically connected to drains of a first P-type field effect transistor and a second P-type field effect transistor, wherein a source of the second P-type field effect transistor is electrically connected to a drain of a third P-type field effect transistor and to a drain of a fourth P-type field effect transistor, wherein sources of the first P-type field effect transistor, the third P-type field effect transistor and the fourth P-type field effect transistor are electrically connected to a first voltage, wherein a gate of the N-type field effect transistor is selectively connected by the multiplexer to one of a second voltage and a third voltage that is lower than the second voltage, and wherein the comparator circuit is electrically connected to a test node at the drains of the third P-type field effect transistor and the fourth P-type field effect transistor and at the source of the second P-type field effect transistor.

7. The integrated circuit chip of claim 1, wherein the test circuit comprises an N-type field effect transistor comprising the test device, and wherein the stress conditions bias the test device in inversion so that the test device is susceptible to positive bias temperature instability.

8. An integrated circuit chip comprising:

a substrate; and multiple cascaded reliability monitors on the substrate, wherein the multiple cascaded reliability monitors are essentially identical, wherein each reliability monitor comprises: a test circuit comprising a test device; a reference circuit comprising a reference device; and a comparator circuit connected to the test circuit and the reference circuit, wherein each reliability monitor is alternatingly operable in stress and test modes when the integrated circuit chip is powered on and when the reliability monitor is enabled, wherein, during each stress mode, the test device is subjected to stress conditions that emulate operating conditions of a functional device and the reference device is unstressed, wherein, during each test mode, the stress conditions are removed from the test device and the comparator circuit compares a test parameter of the test device to a reference parameter of the reference device and outputs a status signal based on a difference between the test parameter and the reference parameter, wherein, when the difference between the test parameter and the reference parameter reaches a predetermined threshold amount, during a test mode, the status signal switches values and then remains constant, and wherein the multiple cascaded reliability monitors comprise at least a first reliability monitor enabled by an enabled signal and a second reliability monitor coupled to the first reliability monitor such that the second reliability monitor is enabled when the status signal output from the first reliability monitor switches values.

9. The integrated circuit chip of claim 8, wherein, when the integrated circuit chip is powered off and back on, status signals output from the reliability monitors are automatically reset to corresponding last held values.

10. The integrated circuit chip of claim 8, wherein operation of the multiple cascaded reliability monitors is controlled by clock signals when the integrated circuit chip is powered on such that, once enabled, each reliability monitor periodically switches operation from a stress mode to the test mode and back.

11. The integrated circuit chip of claim 8, wherein the comparator circuit comprises:

a current mirror;

a voltage latch; and a status latch, wherein the current mirror comprises:

a first leg comprising first nodes coupled to the test circuit and the voltage latch, respectively, such that, during the test mode, a first current flows through one first node to the test device and such that an analog test voltage is exhibited at another first node; and a second leg comprising second nodes coupled to the reference circuit and the voltage latch, respectively, such that, during the test mode, a second current flows through one second node to the reference device and such that an analog reference voltage is exhibited at another second node, wherein the voltage latch senses the analog test voltage and the analog reference voltage and converts the analog test voltage to a digital test voltage and the analog reference voltage to a digital reference voltage, and wherein the status latch senses the digital test voltage and the digital reference voltage and outputs the status signal based on the digital test voltage and the digital reference voltage.

12. The integrated circuit chip of claim 11, wherein the current mirror has a hysteresis function enabled by the status signal.

13. The integrated circuit chip of claim 8, wherein the test circuit comprises:

an N-type field effect transistor comprising the test device;

a multiplexer; and a plurality of P-type field effect transistors, wherein the stress conditions bias the test device so that the test device is susceptible to hot electron injection-induced saturation drain current degradation, wherein a source of the N-type field effect transistor is electrically connected to ground and a drain of the N-type field effect transistor is electrically connected to drains of a first P-type field effect transistor and a second P-type field effect transistor, wherein a source of the second P-type field effect transistor is electrically connected to a drain of a third P-type field effect transistor and to a drain of a fourth P-type field effect transistor, wherein sources of the first P-type field effect transistor, the third P-type field effect transistor and the fourth P-type field effect transistor are electrically connected to a first voltage, wherein a gate of the N-type field effect transistor is selectively connected by the multiplexer to one of a second voltage and a third voltage that is lower than the second voltage, and wherein the comparator circuit is electrically connected to a test node at the drains of the third P-type field effect transistor and the fourth P-type field effect transistor and at the source of the second P-type field effect transistor.

14. The integrated circuit chip of claim 8, wherein the test circuit comprises an N-type field effect transistor comprising the test device, and wherein the stress conditions bias the test device in inversion so that the test device is susceptible to positive bias temperature instability.

15. A reliability monitoring method comprising:

powering on an integrated circuit chip comprising a reliability monitor comprising:

a test circuit comprising a test device;

a reference circuit comprising a reference device, *wherein the test device and the reference device are duplicates of a functional device of the integrated circuit chip*; and a comparator circuit connected to the test circuit and the reference circuit; and after the powering on of the integrated circuit chip, enabling the reliability monitor so that the reliability monitor alternatingly operates in stress and test modes, wherein operating the reliability monitor in a stress mode comprises: subjecting the test device to stress conditions that emulate operating conditions of [a] *the* functional device; and leaving the reference device unstressed, and wherein operating the reliability monitor in a test mode comprises: removing the stress conditions from the test device; comparing a test parameter of the test device to a reference parameter of the reference device; and outputting a status signal based on a difference between the test parameter and the reference parameter*;*

*the reliabililty monitoring method further comprising when the status signal output by the reliability monitor switches values, enabling a second reliability monitor on the integrated circuit chip so that the second reliability monitor alternatingly operates in stress and test modes.*

16. The reliability monitoring method of claim 15, wherein the outputting of the status signal comprises:

when the difference between the test parameter and the reference parameter reaches a predetermined threshold amount, during the test mode, switching values of the status signal and, after the switching, ensuring that the status signal remains constant; and when the integrated circuit chip is powered off and back on, automatically resetting the status signal to a last held value.

17. The reliability monitoring method of claim 15, further comprising controlling operation of the reliability monitor using clock signals such that, when the integrated circuit chip is powered on and the reliability monitor is enabled, operation of the reliability monitor periodically switches from the stress mode to the test mode and back.

18. The reliability monitoring method of claim 15, wherein the comparing comprises:

generating an analog test voltage based on a test current flowing to the test device and an analog reference voltage based on a reference current flowing to the reference device;

converting the analog test voltage to a digital test voltage and the analog reference voltage to a digital reference voltage; and outputting the status signal with a low value when the digital test voltage and the digital reference voltage are equal and with a high value when the digital test voltage and the digital reference voltage are different.

19. The reliability monitoring method of claim 15, wherein the test circuit comprises an N-type field effect transistor comprising the test device, and wherein the stress conditions bias the test device so that the test device is susceptible to one of the following: hot electron injection-induced saturation drain current degradation and positive bias temperature instability.

[20. The reliability monitoring method of claim 15, further comprising, when the status signal output by the reliability monitor switches values, enabling a second reliability monitor on the integrated circuit chip so that the second reliability monitor alternatingly operates in stress and test modes.]

*21. An Integrated Circuit (IC), comprising:*

*an electronic circuit comprising multiple electronic components; and*

*reliability monitoring circuitry embedded in the IC, which is configured to assess, during operation of the IC in a host system, one or more parameters indicative of a reliability of one or more components-of-interest, selected from among the electronic components, and to provide an output indicative of the reliability of the one or more components-of-interest;*

*wherein the IC further comprises a plurality of duplicate components that are configured to mimic one of the one or more components-of-interest, and wherein the reliability monitoring circuitry is coupled to the plurality of duplicate components and is configured to assess the one or more parameters on the plurality of duplicate components; and*

*wherein a plurality of the duplicate components mimicking a same component-of-interest is cascaded, and wherein the reliability monitoring circuitry is configured to assess the one or more parameters for the same component-of interest based on corresponding parameters assessed on the plurality of the duplicate components.*

*22. The IC according to claim 21, wherein the one or more parameters includes at least one of a voltage, a current, and a temperature of the one or more components-of-interest.*

*23. The IC according to claim 21, wherein a duplicate component of the plurality of duplicate components is configured to mimic a respective component-of-interest by undergoing a usage pattern that mimics the usage pattern of the respective component-of-interest.*

*24. The IC according to claim 21, wherein at least one of the one or more components-of-interest comprises a Field-Effect Transistor (FET), and wherein the reliability monitoring circuitry is configured to assess for the FET at least one or both of (i) a drain-side saturation current and (ii) a threshold voltage.*

*25. The IC according to claim 21, wherein the reliability monitoring circuitry is configured to issue an alert in response to the reliability violating a predefined condition, the predefined condition being indicative of a change in the one or more parameters by a threshold amount.*

*26. The IC according to claim 21, wherein the one or more components-of-interest include at least one of active semiconductor devices.*

*27. The IC according to claim 21, wherein the output is indicative of an amount of time for which the one or more components-of-interest is powered on.*

*28. The IC according to claim 21, wherein the output indicates whether the one or more components-of-interest is approaching an end of its useful life.*

*29. The IC according to claim 21, wherein the reliability monitoring circuitry is configured to:*

*subject a first duplicate component of the plurality of duplicate components to a usage pattern that mimics the usage pattern of the respective component-of-interest while not subjecting a second duplicate component of the plurality of duplicate components to the usage pattern;*

*compare a first parameter of the one or more parameters assessed on the first duplicate component to a second parameter of the one or more parameters assessed on the second duplicate component; and*

*provide the output based on the comparison of the first parameter and the second parameter.*

*30. The IC according to claim 21, wherein the reliability monitoring circuitry is configured to:*

*assess, during an initial time period of operation of the one or more components-of-interest, a first parameter of the one or more parameters on a first duplicate component of the plurality of duplicate components;*

*assess, during a subsequent time period of operation of the one or more components-of-interest, a second parameter of the one or more parameters on a second duplicate component of the plurality of duplicate components; and*

*provide a second output indicative of end-of-life of the one or more components-of-interest based on a comparison of the respective first and second parameters.*

*31. A method for reliability monitoring in an Integrated Circuit (IC) comprising multiple electronic components, the method comprising:*

*configuring reliability monitoring circuitry embedded in the IC, to assess, during operation of the IC in a host system, one or more parameters indicative of a reliability of one or more components-of-interest, selected from among the electronic components; and*

*providing, from the reliability monitoring circuitry embedded in the IC, an output indicative of the reliability of the one or more components-of-interest;*

*wherein assessing the one or more parameters comprises assessing the one or more parameters of a plurality of duplicate components in the IC, which are configured to mimic the one or more components-of-interest;*

*the method for reliability monitoring further comprising:*

*cascading a plurality of the duplicate components to mimic a same component-of-interest; and*

*assessing the one or more parameters for the same component-of-interest based on corresponding parameters assessed on the plurality of the duplicate components.*

*32. The method for reliability monitoring according to claim 31, further comprising:*

*subjecting a first duplicate component of the one or more duplicate components to a usage pattern that mimics the usage pattern of the respective component-of-interest while not subjecting a second duplicate component of the one or more duplicate components to the usage pattern;*

*comparing a first parameter of the one or more parameters assessed on the first duplicate component to a second parameter of the one or more parameters assessed on the second duplicate component; and*

*providing the output based on the comparison of the first parameter and the second parameter.*

*33. The method for reliability monitoring according to claim 31, further comprising:*

*assessing, during an initial time period of operation of the one or more components-of-interest, a first parameter of the one or more parameters on a first duplicate component of the one or more duplicate components;*

*assessing, during a subsequent time period of operation of the one or more components-of-interest, a second parameter of the one or more parameters on a second duplicate component of the one or more duplicate components; and*

*providing a second output indicative of end-of-life of the one or more components-of-interest based on a comparison of the respective first and second parameters.*

*34. The method for reliability monitoring according to claim 31, further comprising selecting at least one of a voltage, a current, and a temperature of the one or more components-of-interest as the one or more parameters.*

*35. The method for reliability monitoring according to claim 31, further comprising configuring a duplicate component of the plurality of duplicate components to mimic a respective component of-interest by undergoing a usage pattern that mimics the usage pattern of the respective component-of-interest.*

*36. The method for reliability monitoring according to claim 31, further comprising issuing an alert in response to the reliability violating a predefined condition, the predefined condition being indicative of a change in the one or more parameters by a threshold amount.*

*37. The method for reliability monitoring according to claim 31, further comprising selecting at least one of active semiconductor devices as the one or more components-of-interest.*

*38. The method for reliability monitoring according to claim 31, further comprising indicating using the output at least one of (i) an amount of time for which the one or more components-of-interest is powered on and (ii) whether the one or more components-of-interest is approaching an end of its useful life.*

* * * * *